US012176865B2

(12) United States Patent
Leong et al.

(10) Patent No.: US 12,176,865 B2
(45) Date of Patent: Dec. 24, 2024

(54) INTEGRATED LOW-NOISE AMPLIFIER OF COMPACT LAYOUT

(71) Applicant: Realtek Semiconductor Corp., Hsinchu (TW)

(72) Inventors: Pohboon Leong, Pleasanton, CA (US); Wing Fai Loke, San Jose, CA (US); Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 541 days.

(21) Appl. No.: 17/500,987

(22) Filed: Oct. 14, 2021

(65) Prior Publication Data

US 2023/0123165 A1    Apr. 20, 2023

(51) Int. Cl.
*H03F 1/56* (2006.01)
*H03F 1/26* (2006.01)
(Continued)

(52) U.S. Cl.
CPC .............. *H03F 1/565* (2013.01); *H03F 1/26* (2013.01); *H03F 3/193* (2013.01); *H04B 1/18* (2013.01);
(Continued)

(58) Field of Classification Search
CPC . H03F 1/565; H03F 1/26; H03F 3/193; H03F 2200/294; H03F 2200/451;
(Continued)

(56) References Cited

U.S. PATENT DOCUMENTS

| 10,879,851 B2 | 12/2020 | Ghanevati et al. |
| 11,888,453 B2 * | 1/2024 | Medra ..................... H03F 1/347 |
| 2007/0205829 A1 | 9/2007 | Kao et al. |

FOREIGN PATENT DOCUMENTS

| CN | 109194295 A | 1/2019 |
| CN | 113067554 A | 7/2021 |

(Continued)

OTHER PUBLICATIONS

TW Office Action dated 2022-09-07 in Taiwan application No. 111103415.

(Continued)

*Primary Examiner* — Andrea Lindgren Baltzell
*Assistant Examiner* — Khiem D Nguyen
(74) *Attorney, Agent, or Firm* — McClure, Qualey & Rodack, LLP

(57) ABSTRACT

A LNA (low-noise amplifier) includes a matching network configured to provide a three-way coupling between an input node, a matched node, and a source node; a gate capacitor configured to provide AC (alternate current) coupling between the matched node and a gate node; a cascode amplifier configured to receive a gate voltage at the gate node and output an output voltage at an output node in accordance with a source degeneration at the source node; and a load network connected to the output node, wherein the matching network having a shunt inductor and a series inductor that are overlapped in layout to have a strong mutual coupling and a source degenerating inductor that is laid out in a close proximity to the shunt inductor to have a strong mutual coupling.

18 Claims, 3 Drawing Sheets

(51) Int. Cl.
*H03F 3/193* (2006.01)
*H04B 1/18* (2006.01)

(52) U.S. Cl.
CPC .. *H03F 2200/294* (2013.01); *H03F 2200/451* (2013.01)

(58) Field of Classification Search
CPC ......... H03F 2200/216; H03F 2200/222; H03F 1/223; H03F 1/523; H04B 1/18
USPC ........................................................ 330/302
See application file for complete search history.

(56) References Cited

FOREIGN PATENT DOCUMENTS

| TW | I335128 B | 12/2010 |
|----|-----------|---------|
| TW | I505632 B | 10/2015 |

OTHER PUBLICATIONS

Search Report issued in TW Office Action dated Sep. 7, 2022 in Taiwan application No. 111103415.

\* cited by examiner

INTEGRATED LOW-NOISE AMPLIFIER OF COMPACT LAYOUT

BACKGROUND OF THE DISCLOSURE

Field of the Disclosure

This present invention generally relates to low-noise amplifier, and particularly to integrated low-noise amplifier of compact layout.

Description of Related Art

As shown in FIG. 1, a conventional low-noise amplifier (hereafter LNA) 100 receives an input voltage $V_I$ and output an output voltage $V_O$ and comprises: an impedance-matching inductor 111; an AC (alternate current) coupling capacitor 121; a cascode amplifier 130 comprising a first NMOS (n-channel metal oxide semiconductor) transistor 131, a second NMOS transistor 132, a DC (direct current) coupling resistor 134, and a source degenerating inductor 133; and a load network 150 comprising a parallel connection of a load inductor 151 and a load capacitor 152. Throughout this disclosure, "$V_{DD}$" denotes a power supply node. The first NMOS transistor 131 embodies a common-source stage, and the source degenerating inductor 133 is used to cause an input impedance of the common-source stage to have a real part. The DC coupling resistor 134 is used to couple a first bias voltage $V_A$ to a gate of the first NMOS transistor 131 and establishes a proper biasing condition for the first NMOS transistor 131. AC coupling capacitor 121 is used to block a DC component of the input voltage $V_I$. The second NMOS transistor 132 is biased by a second bias voltage $V_B$ and embodies a common-gate stage that is used to provide a reverse isolation for the cascode amplifier 130. LNA 100 is a well-known circuit and thus not further described in detail.

A performance of a LNA is often characterized by its "return loss" and "noise figure," and a high return loss and a low noise figure are desirable; a high return loss can be achieved by applying a good impedance matching, while a low noise figure can be achieved by applying a good noise matching; these are well understood by those of ordinary skill in the art and thus not explained in detail here. In a particular embodiment of interest, LNA 100 is an integrated circuit fabricated on a silicon substrate using a CMOS (complementary metal oxide semiconductor) process technology; in this case, inductors 111 and 133 may occupy a large layout area and cause LNA 100 to be expensive. Besides, to protect the first NMOS transistor 131 in an electrostatic discharge (ESD) event, an ESD protection circuit 170 comprising a parallel connection of a forward diode 171 and a reverse diode 172 is often used. Also, a bonding pad is needed for packaging the integrated circuit, and it effectively results in a parasitic capacitor 160. Both the parasitic capacitor 160 and the ESD protection circuit 170 may result in a serious degradation of return loss, noise figure, or both.

What is desired is an integrated LNA that can have a compact layout area, good ESD protection, and good performance.

SUMMARY OF THE DISCLOSURE

In an embodiment, a LNA (low-noise amplifier) comprises: a matching network configured to provide a three-way coupling between an input node, a matched node, and a source node; a gate capacitor configured to provide AC (alternate current) coupling between the matched node and a gate node; a cascode amplifier configured to receive a gate voltage at the gate node and output an output voltage at an output node in accordance with a source degeneration at the source node; and a load network connected to the output node, wherein the matching network comprises a shunt inductor and a series inductor that are overlapped in layout to have a strong mutual coupling and a source degenerating inductor that is laid out in a close proximity to the shunt inductor to have a strong mutual coupling.

In an embodiment, a LNA (low-noise amplifier) comprises: a shunt inductor configured to shunt an input node to ground; a series inductor configured to couple the input node to a matched node; a source degenerating inductor configured to couple a source node to ground; a gate capacitor configured to couple the matched node to a gate node; a cascode amplifier configured to receive a gate voltage at the gate node and output an output voltage at an output node in accordance with a source degeneration at the source node; and a load network connected to the output node, wherein the shunt inductor and the series inductor are overlapped in layout to have a strong mutual coupling, and the source degenerating inductor is laid out in a close proximity to the shunt inductor to have a strong mutual coupling.

DETAILED DESCRIPTION OF THIS DISCLOSURE

Figure 1:
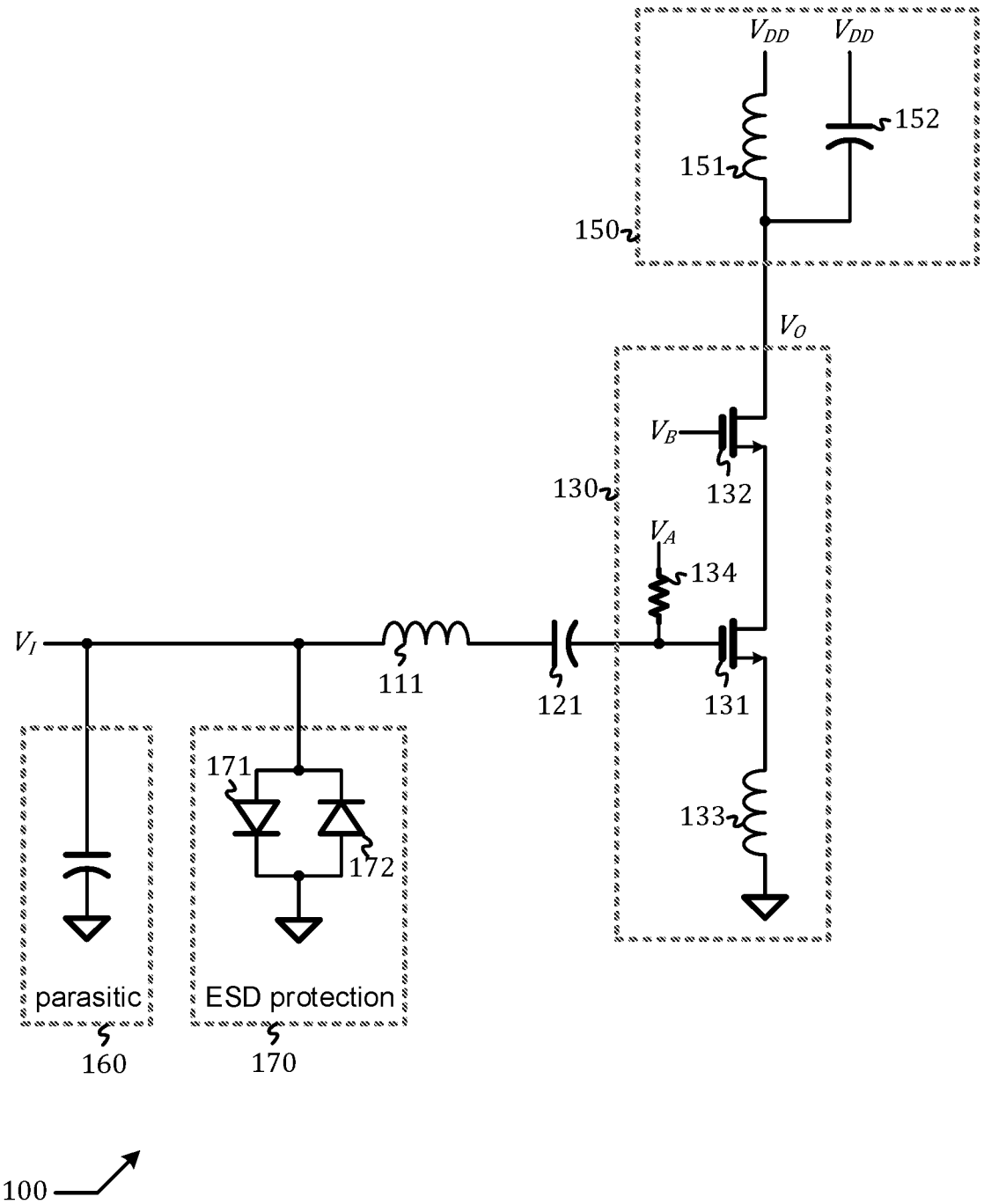
FIG. 1 shows a schematic diagram of a conventional low-noise amplifier.

The present disclosure is directed to low-noise amplifier. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "bias," "noise," "return loss," "inductor," "capacitor," "resistor," "mutual coupling," "common-source," "common-gate," "cascode," "load," "source degeneration," "resonant tank," "parallel connection," "series," "shunt," "via," "circuit node," "ground," "power supply," "frequency," "AC (alternate current)," "DC (direct current)," "MOS (metal oxide semiconductor) transistor," "CMOS (complementary metal oxide semiconductor) process technology," "NMOS (n-channel metal oxide semiconductor) transistor," and "PMOS (p-channel metal oxide semiconductor) transistor." Terms and basic concepts like these, when used in a context of microelectronics, are apparent to those of ordinary skill in the art and thus will not be explained in detail here.

Those of ordinary skills in the art understand units such as nH (nano-Henry), pH (pico-Henry), pF (pico-Farad), nm (nanometer), and µm (micron) without a need of explanations.

Those of ordinary skills in the art can read schematics of a circuit comprising electronic components such as inductors, capacitors, resistors, NMOS transistors, PMOS transistors, and so on, and do not need a verbose description about how one component connects with another in the schematics. Those of ordinary skill in the art can also recognize a ground symbol, a capacitor symbol, an inductor symbol, a resistor symbol, and symbols of PMOS transistor and NMOS transistor, and identify the "source terminal," the "gate terminal," and the "drain terminal" thereof. Pertaining to a MOS transistor, for brevity, hereafter, "source terminal" is simply referred to as "source," "gate terminal" is simply referred to "gate," and "drain terminal" is simply referred to "drain."

A MOS transistor, PMOS or NMOS, has a threshold voltage. A MOS transistor is turned on when its gate-to-source voltage is larger than its threshold voltage (in absolute value). When a MOS transistor is turned on, a difference between its gate-to-source voltage and its threshold voltage in absolute value is referred to as an "over-drive voltage." A MOS transistor is in a "saturation region" when it is turned on and its over-drive voltage is smaller than its drain-to-source voltage (in absolute value). A MOS transistor is an effective gain device only when it is in the "saturation region."

As is known, a circuit is generally a collection of circuit components, like transistors, capacitors, resistors, and/or other electronic devices interconnected in a certain manner to embody a certain function.

A network is a circuit or a collection of circuits.

In this disclosure, a "circuit node" is frequently simply stated as a "node" for short, when what it means is clear from a context.

Figure 2:
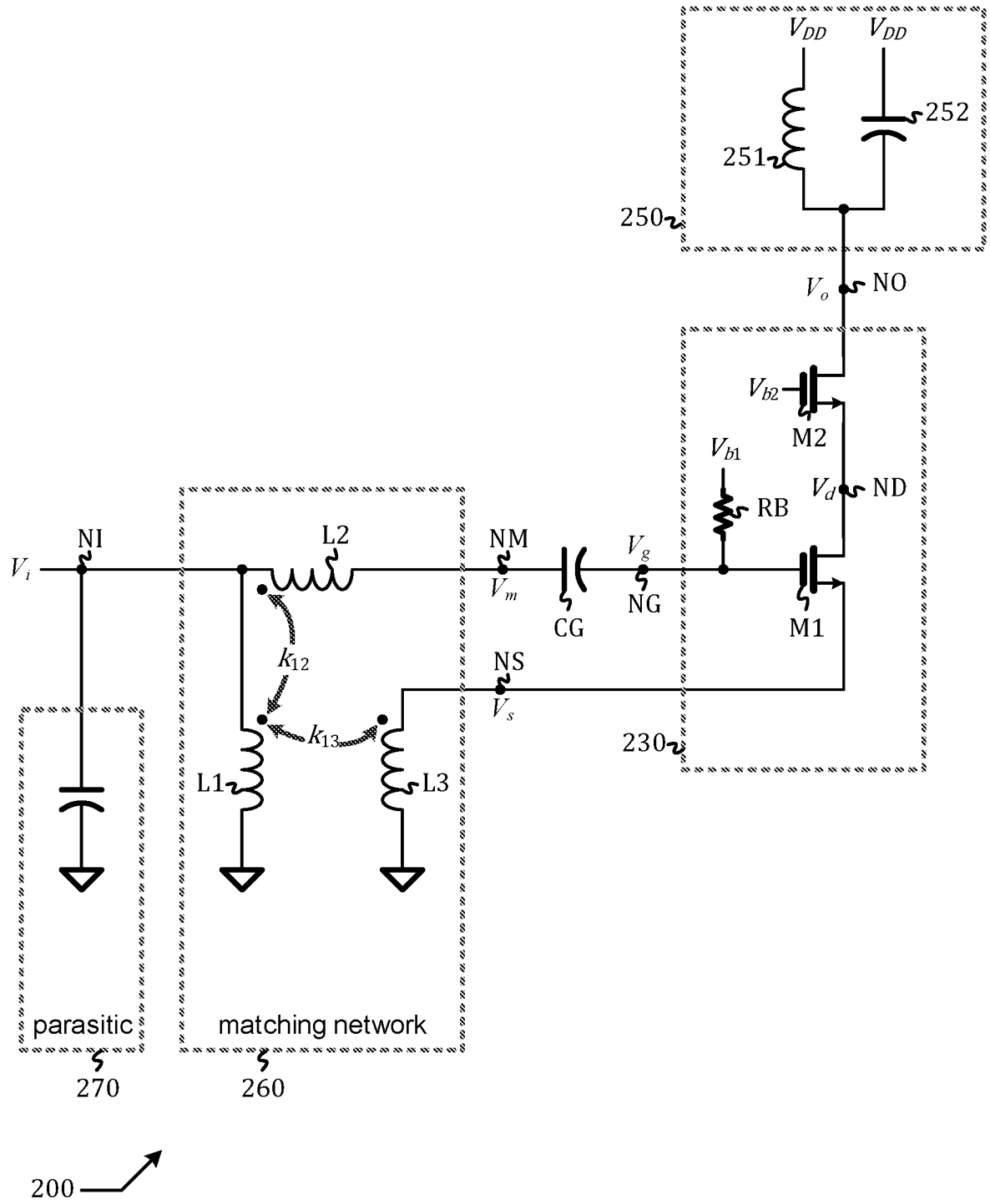
FIG. 2 shows a schematic diagram of a low-noise amplifier in accordance with an embodiment of the present disclosure.

A schematic diagram of a low-noise amplifier (LNA) 200 in accordance with an embodiment of the present disclosure is shown in FIG. 2. LNA 200 comprises: a matching network 260 configured to provide a three-way coupling between an input node NI, a matched node NM, and a source node NS to fulfill a combined function of impedance matching (between the input node NI and the matched node NM) and source degeneration (at the source node NS); a gate capacitor CG configured to provide AC (alternate current) coupling between the matched node NM and a gate node NG; a cascode amplifier 230 configured to receive a gate voltage $V_g$ at the gate node NG and output an output voltage $V_o$ at an output node NO in accordance with a source degeneration at the source node NS; and a load network 250 connected to the output node NO. In addition, there is a parasitic capacitor 270 at the input node NI resulting from a bond pad used for packaging LNA 200 on a QFN (quad-flat-no-leads) package, for instance. LNA 200 can be thought of as a variant of LNA 100 by applying the following changes: the ESD protection circuit 170 is removed; inductor 111 is replaced by the matching network 260; and the source degenerating inductor 133 is incorporated as a part of the matching network 260.

The matching network 260 comprises three inductors including a shunt inductor L1 configured to shunt the input node NI to ground, a series inductor L2 configured to couple the input node NI to the matched node NM, and a source degenerating inductor L3 configured to couple the source node NS to ground, wherein the shunt inductor L1 and the series inductor L2 are overlapped in layout to have a strong mutual coupling $k_{12}$, and the source degenerating inductor L3 is laid out in a close proximity to the shunt inductor L1 to have a strong mutual coupling $k_{13}$. A purpose of the shunt inductor L1 is two-fold: first, it helps to compensate the parasitic capacitor 270 at the input node NI and thus allows a better impedance matching and noise matching; second, it provides an effective discharge path in an ESD (electrostatic discharge) event and eliminates a need of using an ESD protection circuit (such as the ESD protection circuit 170). In an embodiment, the shunt inductor and the series inductor are laid out in a concentric topology, and a part of the source degenerating inductor is adjacent to and parallel with a part of the shunt inductor.

This arrangement offers a few advantages. First, it provides a strong coupling from the shunt inductor L1 to the series inductor L2, thus increasing of an effective inductance of the series inductor L2 and consequently allowing designers to use a smaller inductance value for the series inductor L2; second, the shunt inductor L1 is overlapped with the series inductor L2 in the layout and thus is highly area efficient; and third, it provides a strong coupling from the shunt inductor L1 to the source degenerating inductor L3 and thus boosts an effectiveness of the source degeneration for the common-source cascode amplifier 230.

The gate capacitor CG provides an effective AC (alternate current) coupling so that an AC component of a matched voltage $V_m$ at the matched node NM is approximately equal to an AC component of the gate voltage $V_g$.

The cascode amplifier 230 comprises a common-source stage comprising a first NMOS transistor M1 and a common-gate stage comprising a second NMOS transistor M2. The first NMOS transistor M1 is configured to receive the gate voltage $V_g$ at the gate node NG and output a drain voltage $V_d$ at a drain node ND in accordance with: a biasing condition established by a first bias voltage $V_{b1}$ via a DC (direct current) coupling resistor RB; and a source degeneration at the source node NS. The second NMOS transistor M2 is configured to receive the drain voltage $V_d$ at the drain node ND and output the output voltage $V_o$ at the output node NO in accordance with a biasing condition established by a second bias voltage $V_{b2}$. Here, "$V_{DD}$" denotes a power supply node, and $V_s$ denotes a voltage at the source node NS. The first bias voltage $V_{b1}$ and the second bias voltage $V_{b2}$ are chosen so that both the first NMOS transistor M1 and the second NMOS transistor M2 are biased in the saturation region.

In an alternative embodiment not shown in FIG. 2 but clear to those of ordinary skill in the art, the DC coupling of the first bias voltage $V_{b1}$ to the gate node NG is cut off, and instead the DC coupling resistor RB is placed across the gate node NG and the drain node ND. In this case, the first NMOS transistor M1 is said to be "self-biased," which is a concept well understood by those of ordinary skill in the art and thus not described in detail.

The load network 250 is a resonant tank comprising a parallel connection of a load inductor 251 and a load capacitor 252, wherein a resonant frequency of the resonant tank is approximately equal to a frequency of interest of an input voltage $V_i$ at the input node NI. In an embodiment, the load capacitor 252 is tunable and is tuned in accordance with the frequency of interest. Concepts and embodiments of tunable capacitor are well known by those of ordinary skill in the art and thus not described in detail here.

Figure 3:
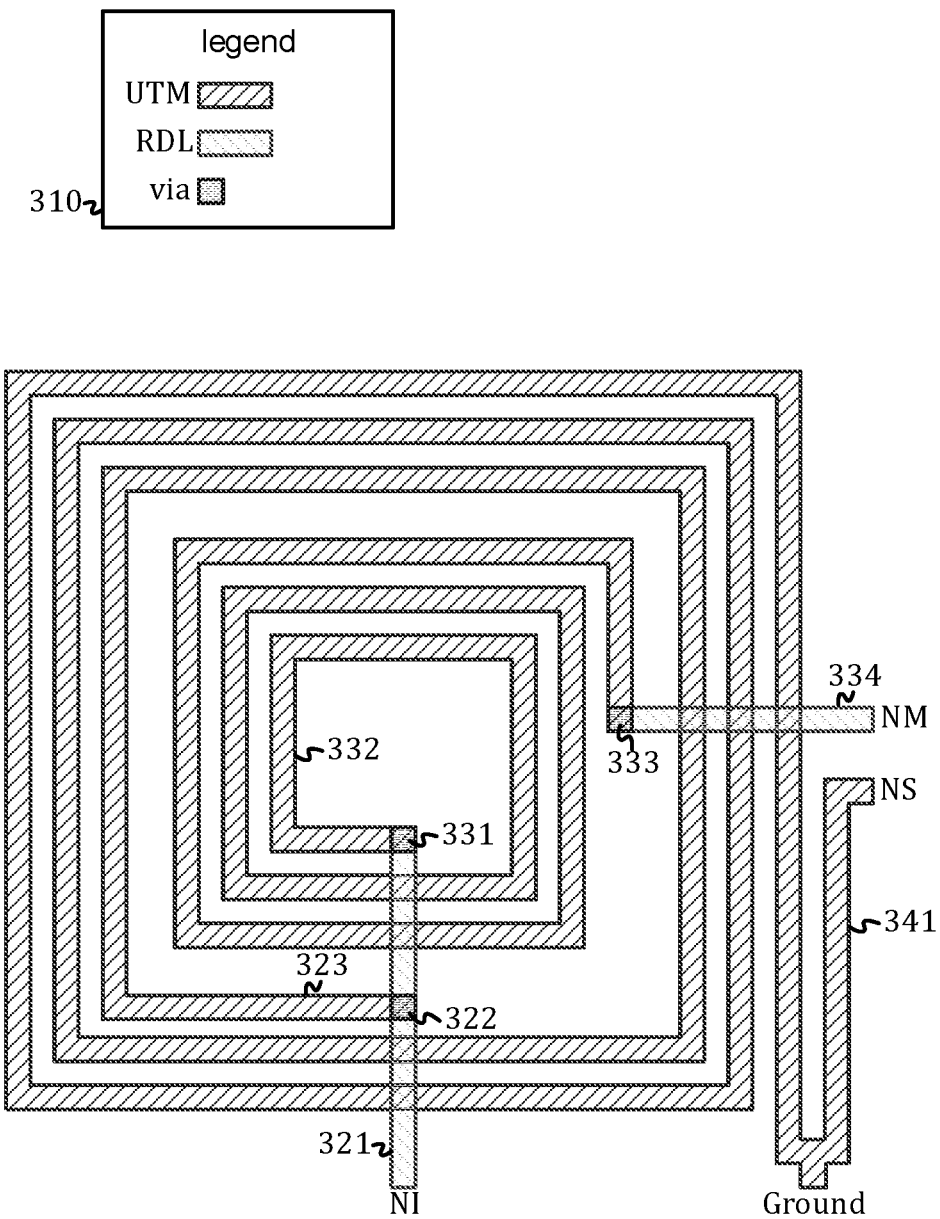
FIG. 3 shows a top view of a layout of a matching network for the low-noise amplifier of FIG. 2 in accordance with an embodiment of the present disclosure.

In an embodiment, by way of example but not limitation, LNA 200 is fabricated on a silicon substrate using a 55 nm CMOS process technology that includes a plurality of metal layers including a RDL (redistribution layer) and an UTM (ultra-thick metal) layer, and a via layer that is used to make a connection between a metal on the RDL and a metal on the UTM layer. A top view of a layout of the matching network 260 in accordance with an embodiment of the present disclosure is shown in FIG. 3. A legend is shown in box 310. The shunt inductor L1 is embodied by metal trace 321 (on RDL) that extends from the input node NI to junction point 322 and metal trace 323 (on UTM) that spirals outward in a clockwise direction from junction point 322 to the ground, wherein metal trace 321 and metal trace 323 are connected through a via at junction point 322. The metal trace 321 further extends to junction point 331. The series inductor L2 is embodied by a metal trace 332 (on UTM) that spirals outward in a clockwise direction from junction point 331 to junction point 333 and metal trace 334 (on RDL) that extends from junction point 333 to the matched node NM, wherein metal trace 332 is connected to metal trace 321 through a via at junction point 331, and metal trace 334 is connected to metal trace 332 through a via at junction point 333. The source degenerating inductor L3 is embodied by metal trace 341 (on UTM) that extends from the source node NS to ground. As shown, the shunt inductor L1 and the series inductor L2 are overlapped and laid out in a concentric topology; the source degenerating inductor L3 is laid out in close proximity to the shunt inductor L1 and parallel with a last section of the shunt inductor L1.

By way of example but not limitation: $V_{DD}$ is 1.3V; a frequency range of interest is between 5.1 GHz and 7.2 GHz; the shunt inductor L1 is 3.7 nH; the series inductor L2 is 1.1 nH; the source-degenerating inductor L3 is 75 pH; $k_{12}$ is 0.5; $k_{13}$ is 0.2; the gate capacitor CG is 1 pF; W/L (which stands for width/length) of NMOS transistor M1 is 192 μm/80 nm; RB is 36K Ohm; $V_{b1}$ is 0.5V; W/L of NMOS transistor M2 is 192 μm/80 nm; V is 1.1V; load inductor 251 is 1nH; and load capacitor 252 is tunable from 50 fF to 400 fF.

The source degenerating inductor L3 is incorporated to cause an input impedance of the cascode amplifier 230 to have a real part, which is important in both impedance matching and noise matching. This is highly desirable but not absolutely necessary. In other words, designers can choose to remove the source degenerating inductor L3 while a performance of LNA 200 might degrade. In any case, in practice, even if designers choose to remove the source degenerating inductor L3, they still need to connect the source node NS to ground via a metal trace, which will inevitably exhibit an inductive nature and is equivalently a parasitic inductor that is laid out in close proximity to the shunt inductor L1 (which also connects to ground). In other words, in practice, even if designers opt to remove the source degenerating inductor L3, the source degenerating inductor L3 remains there, albeit in a form of parasitic inductor. Therefore, the schematics in FIG. 2 and the appended claims that refer to FIG. 2 remain valid in that scenario.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A low-noise amplifier (LNA) comprising:
   a matching network configured to provide a three-way coupling between an input node, a matched node, and a source node;
   a gate capacitor configured to provide AC (alternate current) coupling between the matched node and a gate node;
   a cascode amplifier configured to receive a gate voltage at the gate node and output an output voltage at an output node in accordance with a source degeneration at the source node; and
   a load network connected to the output node, wherein the matching network comprises a shunt inductor and a series inductor that are overlapped in layout to have a strong mutual coupling and a source degenerating inductor that is laid out in a close proximity to the shunt inductor to have a strong mutual coupling, wherein the load network comprises a parallel connection of a load inductor and a load capacitor.

2. The LNA of claim 1, wherein the shunt inductor and the series inductor are laid out in a concentric topology.

3. The LNA of claim 2, wherein both the shunt inductor and the series inductor spiral outward in the same direction.

4. The LNA of claim 3, wherein a part of the source degenerating inductor is adjacent to and parallel with a part of a last section of the shunt inductor.

5. The LNA of claim 1, wherein the cascode amplifier comprises a common-source stage comprising a first NMOS (n-channel metal oxide semiconductor) transistor configured to receive the gate voltage at the gate node and output a drain voltage at a drain node in accordance with a source degeneration at the source node and a common-gate stage comprising a second NMOS transistor configured to receive the drain voltage at the drain node and output the output voltage at the output node.

6. The LNA of claim 5, wherein the cascode amplifier further comprises a DC (direct current) coupling resistor configured to couple a first bias voltage to the gate node.

7. The LNA of claim 5, wherein the cascode amplifier further comprises a DC (direct current) coupling resistor placed across the gate node and the drain node.

8. The LNA of claim 1, wherein the load capacitor is tunable.

9. The LNA of claim 8, wherein the load capacitor is tuned in accordance with a frequency of interest of an input voltage at the input node.

10. A low-noise amplifier (LNA) comprising:
    a shunt inductor configured to shunt an input node to ground;
    a series inductor configured to couple the input node to a matched node;
    a source degenerating inductor configured to couple a source node to ground;
    a gate capacitor configured to couple the matched node to a gate node;
    a cascode amplifier configured to receive a gate voltage at the gate node and output an output voltage at an output node in accordance with a source degeneration at the source node; and
    a load network connected to the output node, wherein the shunt inductor and the series inductor are overlapped in layout to have a strong mutual coupling, and the source degenerating inductor is laid out in a close proximity to the shunt inductor to have a strong mutual coupling, wherein the load network comprises a parallel connection of a load inductor and a load capacitor.

11. The LNA of claim 10, wherein the shunt inductor and the series inductor are laid out in a concentric topology.

12. The LNA of claim 11, wherein both the shunt inductor and the series inductor spiral outward in the same direction.

13. The LNA of claim 12, wherein a part of the source degenerating inductor is adjacent to and parallel with a part of a last section of the shunt inductor.

14. The LNA of claim 10, wherein the cascode amplifier comprises a common-source stage comprising a first NMOS (n-channel metal oxide semiconductor) transistor configured to receive the gate voltage at the gate node and output a drain voltage at a drain node in accordance with a source degeneration at the source node and a common-gate stage comprising a second NMOS transistor configured to receive the drain voltage at the drain node and output the output voltage at the output node.

15. The LNA of claim 14, wherein the cascode amplifier further comprises a DC (direct current) coupling resistor configured to couple a first bias voltage to the gate node.

16. The LNA of claim 14, wherein the cascode amplifier further comprises a DC (direct current) coupling resistor placed across the gate node and the drain node.

17. The LNA of claim 10, wherein the load capacitor is tunable.

18. The LNA of claim 17, wherein the load capacitor is tuned in accordance with a frequency of interest of an input voltage at the input node.

* * * * *